(12) United States Patent
Mori

(10) Patent No.: US 9,538,695 B2
(45) Date of Patent: Jan. 3, 2017

(54) CARRIER TAPE, PACKAGE TAPE AND SERIES OF ELECTRONIC COMPONENTS

(71) Applicant: MURATA MANUFACTURING CO., LTD., Kyoto (JP)

(72) Inventor: Haruhiko Mori, Kyoto (JP)

(73) Assignee: Murata Manufacturing Co., Ltd., Kyoto-Fu (JP)

(*) Notice: Subject to any disclaimer, the term of this patent is extended or adjusted under 35 U.S.C. 154(b) by 451 days.

(21) Appl. No.: 14/103,739

(22) Filed: Dec. 11, 2013

(65) Prior Publication Data

US 2014/0166534 A1 Jun. 19, 2014

(30) Foreign Application Priority Data

Dec. 14, 2012 (JP) .................. 2012-272918

(51) Int. Cl.
*B65D 73/02* (2006.01)
*H05K 13/00* (2006.01)

(52) U.S. Cl.
CPC .................. *H05K 13/0084* (2013.01)

(58) Field of Classification Search
CPC ....... B65D 73/02; B65D 75/30; B65D 75/323; B65D 75/327; H05K 13/0084
USPC ............... 206/714, 713, 716, 717, 718, 701
See application file for complete search history.

(56) References Cited

U.S. PATENT DOCUMENTS

| | | | | |
|---|---|---|---|---|
| 3,523,608 A * | 8/1970 | Miller | .................... | B65D 75/42 206/467 |
| 5,115,911 A * | 5/1992 | Schulte | ................ | H05K 13/003 206/341 |
| 5,857,572 A * | 1/1999 | Bird | .................... | H05K 13/003 206/713 |
| 6,003,676 A * | 12/1999 | Beyer | ................ | H05K 13/0084 206/714 |
| 6,216,419 B1 * | 4/2001 | Sakurai | ................... | B65B 9/045 206/713 |
| 7,584,853 B2 * | 9/2009 | Yoshii | ................ | H05K 13/0084 206/713 |

(Continued)

FOREIGN PATENT DOCUMENTS

| | | |
|---|---|---|
| JP | 63-023259 U | 2/1988 |
| JP | 06-286715 A | 10/1994 |

(Continued)

OTHER PUBLICATIONS

An Office Action; "Notice of Reasons for Rejection," issued by the Japanese Patent Office on Nov. 11, 2014, which corresponds to Japanese Patent Application No. 2012-272918 and is related to U.S. Appl. No. 14/103,739; with English language translation.

*Primary Examiner* — Steven A. Reynolds
(74) *Attorney, Agent, or Firm* — Studebaker & Brackett PC

(57) ABSTRACT

A series of electronic components formed using a carrier tape. The carrier tape is adapted to enable smoothly picking up even small-sized electronic components with a suction nozzle. The carrier tape has housing holes housing electronic components therein. The housing holes are arranged in the longitudinal direction. A top tape and a bottom tape are attached to the upper and lower surfaces of the carrier tape. Interval portions between the housing holes are provided with concave slots in their lower surfaces, thereby forming air flow paths. The air flow paths form air passages which enable smoothly picking up the small-sized electronic components using a suction nozzle.

6 Claims, 4 Drawing Sheets

(56) References Cited

U.S. PATENT DOCUMENTS

| | | | | |
|---|---|---|---|---|
| 7,611,016 | B2* | 11/2009 | Wihren | H05K 13/0084 206/519 |
| 8,875,895 | B2* | 11/2014 | Sasamura | H05K 13/0084 206/713 |
| 2002/0070570 | A1 | 6/2002 | Bachthaler et al. | |
| 2004/0035747 | A1* | 2/2004 | Butler | H05K 13/0084 206/714 |
| 2008/0296201 | A1* | 12/2008 | Lalouch | H05K 13/0084 206/714 |

FOREIGN PATENT DOCUMENTS

| | | |
|---|---|---|
| JP | 10-338208 A | 12/1998 |
| JP | 2000-151185 A | 5/2000 |
| JP | 3066370 B1 | 7/2000 |
| JP | 2000-327026 A | 11/2000 |
| JP | 2001-072125 A | 3/2001 |

\* cited by examiner

CARRIER TAPE, PACKAGE TAPE AND SERIES OF ELECTRONIC COMPONENTS

CROSS REFERENCE TO RELATED APPLICATIONS

This application claims benefit of priority to Japanese Patent Application No. 2012-272918 filed Dec. 14, 2012, the entire content of which is incorporated herein by reference.

TECHNICAL FIELD

The technical field relates to carrier tapes made of cardboard which are provided with pluralities of housing holes for housing electronic components therein in states where the housing holes are arranged in the longitudinal direction and penetrates the carrier tape in the thickness direction. The present disclosure further relates to package tapes formed from such carrier tapes, and bottom tapes attached to the lower surfaces of the carrier tapes. The present disclosure further relates to a series of electronic components in the form of rows of plural electronic components which are formed using such package tapes.

BACKGROUND

Series of electronic components of interest for the present disclosure are as follows.

(1) Series of electronic components having a plastic embossed tape as a package tape, wherein concave portions are formed in the plastic base member through embossing processing and, further, the openings of the concave portions are covered with a top tape in a state where electronic components are housed within the concave portions (refer to JP 63-23259 A, for example).

(2) Series of electronic components having a base member made of a cardboard which necessitates a relatively-lower material cost, as a carrier tape, wherein the carrier tape is provided with housing holes which penetrates it, and cover films (a top tape and a bottom tape) are attached, through a heat sealing method, to the opposite surfaces of the carrier tapes in a state where electronic components are housed within the concave portions (refer to JP 6-286715 A, for example).

(3) Series of electronic components having, as a package tape, a cardboard base material which has one main surface maintained to be flat and, further, has the other main surface provided with concave portions, wherein a lid member is attached thereto in such a way as to cover the openings of the concave portions in a state where electronic components are housed within the concave portions (refer to JP 10-338208 A, for example).

Currently, for coping with small-sized electronic components having a planner dimension of 0.6 mm×0.3 mm (hereinafter, which will be referred to as "0603 size", in some cases) or smaller sizes, the main stream has been to employ the series of electronic components which is described in JP 10-338208 A, out of the series of electronic components which are described in JP 63-23259 A, JP 6-286715 A, and JP 3066370 B1. This is because the series of electronic components described in JP 63-23259 A and the series of electronic components described in JP 6-286715 A have inconveniences as follows.

At first, the series of electronic components described in JP 63-23259 A has the problem that the plastic embossed tape necessitates a relatively-higher material cost. On the other hand, in the series of electronic components described in JP 6-286715 A, the top tape is attached to the carrier tape only at its opposite side edges extending in the longitudinal direction, while the bottom tape is attached to the carrier tape over its entire surface except the portions of the housing holes. In this case, when the housing holes are made to have a reduced size for coping with size reduction of the electronic components to be housed therein, if the bottom tape is molten up to its portions for covering the housing holes during heat sealing, this may cause the electronic components housed therein to be adhered to the bottom tape.

However, even with the series of electronic components described in JP 10-338208 A, when the electronic components are picked up from the concave portions in the cardboard package tape, through suction with a suction nozzle, in a mounting process, there is no air passage in the bottom surfaces of the concave portions. This has induced the problem of difficulty of sucking them with the suction nozzle, in some cases. In order to overcome this problem, JP 3066370 B1 discloses a technique for providing air vent opening holes which penetrate the bottom surfaces of the concave portions.

However, when the electronic components to be housed therein have smaller sizes, such as a 0630 size or less, it is hard to form such air vent opening holes. This is because the ratio of the area of such opening holes to the area of the bottom surfaces of the housing holes should be increased and, furthermore, there is a risk of capture of the electronic components by the opening holes. Actually, JP 3066370 B1 makes no disclosure about the sizes of the electronic components to be housed therein.

Further, in the case of the series of electronic components described in JP 10-338208 A, it is necessary to employ, as a package tape, a cardboard base material which has one main surface maintained to be flat and, further, has the other main surface provided with concave portions. However, it should be noted that there are constraints on paper materials which enable such processing, thereby inducing the problem of larger material costs.

SUMMARY

Therefore, it is an object of the present disclosure to provide a carrier tape made of a cardboard which enables smoothly picking up even electronic components with a 0630 size or smaller sizes, therefrom, through suction using a suction nozzle and, further, to provide a package tape constituted by the carrier tape and a bottom tape attached to the lower surface thereof, and a series of electronic components in the form of a row of plural electronic components which is formed using the package tape.

The present disclosure provides a carrier tape having a plurality of housing holes for housing electronic components with a planar dimension of 0.6 mm×0.3 mm or less inside thereof such that the housing holes are arranged in a longitudinal direction and penetrate the carrier tape in a thickness direction. The carrier tape being adapted to be used for forming a series of electronic components in the form of a row of a plurality of electronic components by attaching a top tape to an upper surface of the carrier tape and, also, by attaching a bottom tape to a lower surface of the carrier tape in a state where one of the electronic components is housed within each of the housing holes.

To solve the above described problem, the carrier tape of the present disclosure has interval portions between the housing holes adjacent to each other in the lower surface, with a concave slot which connects the housing holes adjacent to each other. The concave slot functions as an air flow path which causes the housing holes adjacent to each other to communicate with each other, when a package tape or a series of electronic components is formed thereby.

Preferably, the concave slot has a widthwise dimension which is larger than a dimension of the interval portions between the housing holes adjacent to each other, which is measured in the direction of arrangement of the housing holes. With this structure, it is possible to smoothen air flows through the air flow path formed by the concave slot.

Preferably, the pitch of arrangement of the plurality of the housing holes is 1 mm or less. Such a carrier tape has smaller housing holes and, thus, tends to introduce difficulty sucking electronic components with a suction nozzle when no air passage exists near the bottom surfaces of the housing holes. Therefore, the present disclosure is more effective therefor.

Preferably, the concave slot has a bottom surface having a cross-sectional shape which is entirely recessed from opposite ends of the housing holes as starting points, when viewed in the direction of arrangement of the housing holes. With this structure, without making the concave slot have a significantly-larger depth, it is possible to raise expectations for sufficient air flow therethrough. Further, since there is no need for making the concave slot have a significantly-larger depth, it is possible to avoid inconvenience, such as for capture of electronic components thereby.

Preferably, the concave slot has a bottom surface having a bilaterally-symmetric cross-sectional shape when viewed in the direction of arrangement of the housing holes. With this structure, it is possible to stably flow air through the entire housing holes, without inducing unevenness of air flows within the housing holes during suction with a suction nozzle.

The present disclosure is also directed to a package tape including the carrier tape according to the present disclosure, and a bottom tape attached to the lower surface of the carrier tape in such a way as to close lower-surface openings of the housing holes. With the package tape according to the present disclosure, it is possible to form an air flow path defined between the carrier tape and the bottom tape with the concave slot such that the adjacent housing holes are communicated with each other via the air flow path.

The present disclosure is also directed to a series of electronic components including the package tape according to the present disclosure, electronic components housed within the housing holes, and a top tape attached to the upper surface of the carrier tape in such a way as to close upper-surface openings of the housing holes.

With the present disclosure, as described above, the concave slot formed in the carrier tape is caused to function as an air flow path which causes adjacent housing holes to communicate with each other, when the package tape or the series of electronic components is formed thereby. This can provide an air passage in sucking the electronic components to be housed within the housing holes, thereby enabling smoothly picking up even electronic components with a 0630 size or smaller sizes, through suction using a suction nozzle.

DETAILED DESCRIPTION

Hereinafter, an embodiment of the present disclosure will be described, with respect to a carrier tape intended for use with small-sized electronic components with a 0603 size, a package tape, and a series of electronic components.

Figure 1:
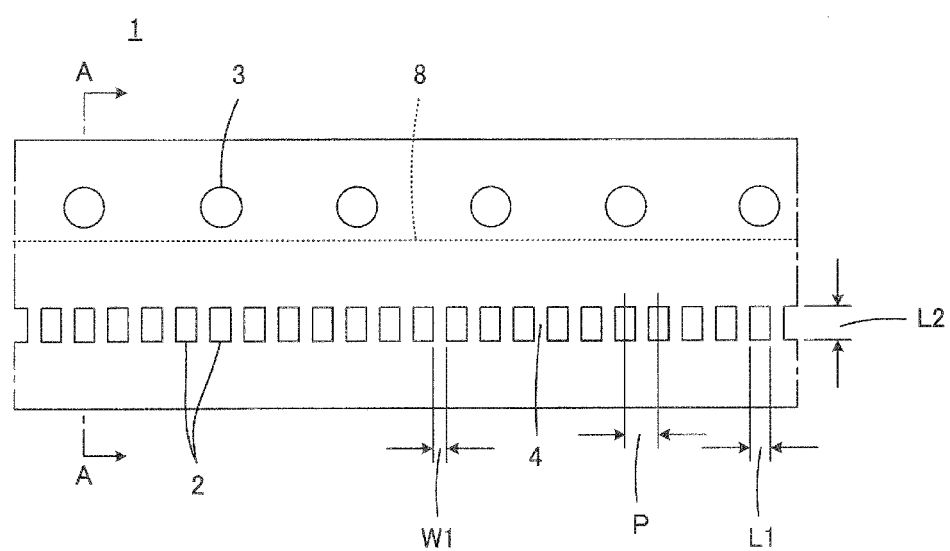
FIG. 1 is a plan view illustrating a carrier tape 1 according to an embodiment of the present disclosure.

FIG. 1 illustrates a carrier tape 1 adapted to size reduction in electronic components as described above. The carrier tape 1 has a plurality of housing holes 2 arranged in the longitudinal direction and, further, has a plurality of feeding holes 3 arranged in parallel with the direction of the arrangement of the plurality of the housing holes 2. The feeding holes 3 are arranged at even intervals at a rate of a single feeding hole per four housing holes 2, for example.

The carrier tape 1 is formed from a tape material made of a resin-impregnated cardboard with a thickness of about 0.5 mm, for example. As examples of dimensions thereof, the housing holes 2 have a dimension L1 of about 0.6 mm which is measured in the direction of the arrangement (the longitudinal direction of the carrier tape 1), and a dimension L2 of about 1.1 mm which is measured in the direction orthogonal to the direction of the arrangement, and the arrangement pitch P of the housing holes 2 is about 1.0 mm. Accordingly, the interval portions 4 between the housing holes 2 adjacent to each other have a dimension W1 of about 0.4 mm which is measured in the direction of the arrangement of the housing holes 2.

Figure 2:
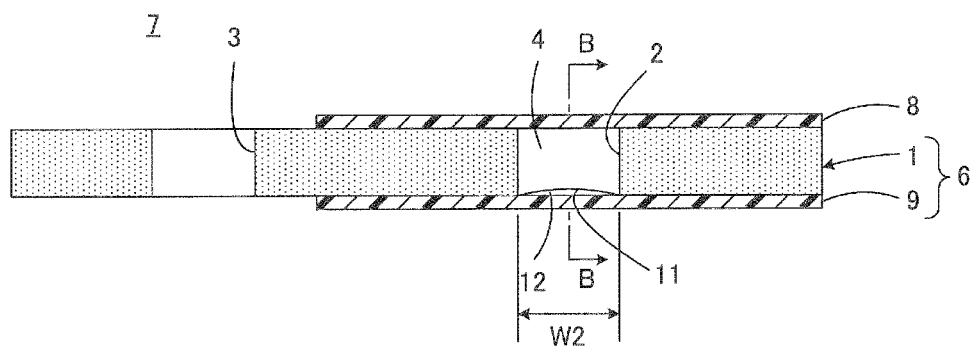
FIG. 2 is a cross-sectional view taken along line A-A of FIG. 1 illustrating a series of electronic components 7 which is formed using the carrier tape 1 illustrated in FIG. 1.
Figure 3:
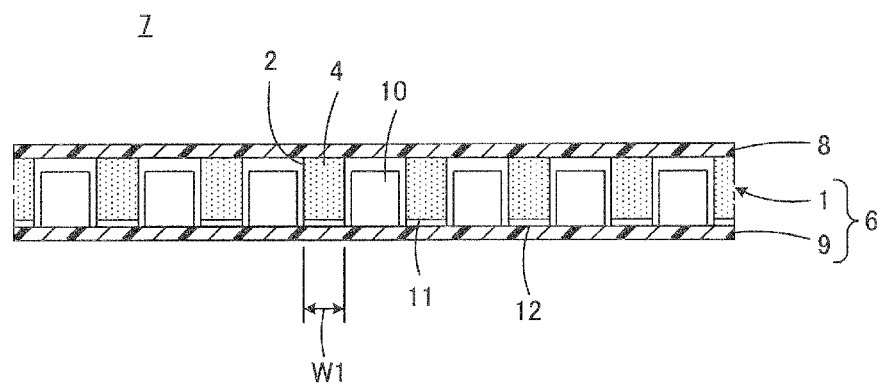
FIG. 3 is a cross-sectional view taken along line B-B of FIG. 2 illustrating the series of electronic components 7 illustrated in FIG. 2.

FIGS. 2 and 3 illustrate cross-sectional views illustrating, in an enlarging manner, a package tape 6 formed using the carrier tape 1, and a series of electronic components 7 which is formed using the package tape 6. In FIGS. 2 and 3, components corresponding to the components illustrated in FIG. 1 are designated by the same reference characters and will not be described redundantly. Further, it should be noted that, in FIGS. 2 and 3, the series of electronic components 7 are illustrated by exaggerating its thickness dimension.

The series of electronic components 7 is constituted by the carrier tape 1, a top tape 8, a bottom tape 9, and a plurality of electronic components 10. In this case, the carrier tape 1 and the bottom tape 8 attached to the lower surface of the carrier tape 1 constitute the package tape 6. In actual scenes of commercial dealings, the electronic components may be either in the form of the series of electronic component 7, in the form of the package tape 6 or in the form of the carrier tape 1.

The series of electronic components 7 will be described in detail, regarding its structure. The housing holes 2 formed in the carrier tape 1 are adapted to house a single chip-type electronic component 10, for example, within each housing hole 2. The top tape 8 and the bottom tape 9 are attached to the upper surface and the lower surface of the carrier tape 1, respectively, through a heat sealing method, for example. Thus, the upper-surface openings and the lower-surface openings of the housing holes 2 are closed thereby, which prevents the electronic components 10 housed in the housing holes 2 from falling out therefrom. In FIG. 1, a broken line indicates the area in which the top tape 8 is placed. This indicates that the top tape 8 and the bottom tape 9 are adapted not to cover the feeding holes 3.

In FIG. 2, for convenience of description, the electronic components 10 housed within the housing holes 2 are not illustrated. With reference to FIG. 2, an interval portion 4 is illustrated over a housing hole 2, and the interval portion 4 is provided with a concave slot 11 in its lower surface. Therefore, between the carrier tape 1 and the bottom tape 9, there is formed an air flow path 12 which is provided by the concave slot 11. As better illustrated in FIG. 3, each concave slot 11 is provided in such a way as to connect adjacent housing holes 2 to each other and, therefore, each air flow path 12 is in a state of causing the adjacent housing holes 2 to communicate with each other.

Generally, the top tape 8 is attached to the carrier tape 1, only at its opposite side edges extending in the longitudinal direction and, on the other hand, the bottom tape 9 is attached to the carrier tape 1, over its entire surface except the portions of the housing holes 2. However, in the present embodiment, the bottom tape 9 forms gaps which form the air flow paths 12, between it and the carrier tape 1, at the portions where the concave slots 11 are formed.

In the embodiment illustrated in the figures, the widthwise dimension W2 of the concave slots (see FIG. 2) is larger than the dimension W1 of the interval portions between the housing holes adjacent to each other (see FIGS. 1 and 3), which is measured in the direction of the arrangement of the housing holes 2. By selecting this dimension relationship, it is possible to smoothen air flows through the air flow paths 12, in a process for picking up the electronic components 10, which will be described later.

Further, as illustrated in FIG. 2, each concave slot 11 has a bottom surface having a cross-sectional shape which is entirely recessed from the opposite ends of the housing holes 2 as starting points, when viewed in the direction of the arrangement of the housing holes 2. Accordingly, it is possible to raise expectations for sufficient air flows through the air flow paths 12, without making the concave slots 11 have a significantly-larger depth. Further, since there is no need for making the concave slots 11 have a significantly-larger depth, it is possible to avoid inconvenience, such as capture of the electronic components 10 thereby.

Further, the bottom surface of each concave slot 11 has a bilaterally-symmetric cross-sectional shape, when viewed in the direction of the arrangement of the housing holes 2. Accordingly, in the process for picking up the electronic components 10, which will be described later, it is possible to stably flow air through the entire housing holes 2, without inducing unevenness of air flows within the housing holes 2 during suction with a suction nozzle.

Figure 4:
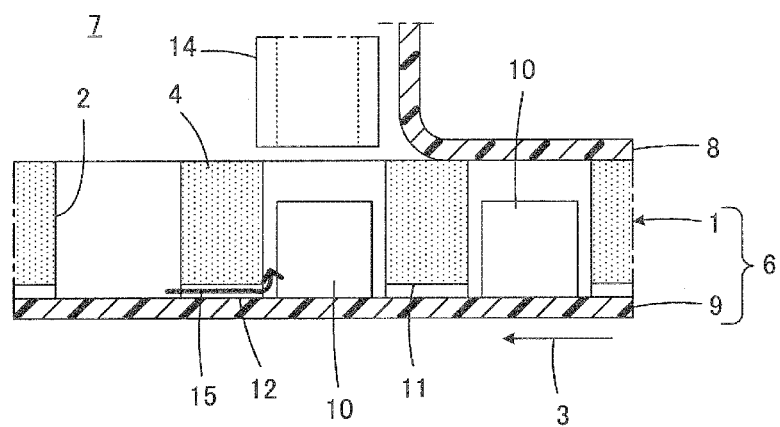
FIG. 4 is an enlarged view of a portion of FIG. 3 for explaining a process for picking up electronic components 10 with a suction nozzle 14.

Next, with reference to FIG. 4, a process for mounting the electronic components 10 will be described. In the process for mounting electronic components 10, the series of electronic components 7 is intermittently transferred in the direction of an arrow 13 through the feeding holes 3 included in the carrier tape 1, while the top tape 8 is stripped off from the carrier tape 1 at a predetermined pickup position. The electronic component 10 within a housing hole 2 is picked up through vacuum suction with a suction nozzle 14 and, in this state, the electronic component 10 is supplied to a predetermined mounting position.

In the picking up process, when the suction nozzle 14 has been brought close to the electronic component 10 to be picked up thereby, air flows, as indicated by an arrow 15, into the housing hole 2 housing the electronic component 10 to be picked up, from the housing hole 2 next thereto in the downstream side in the transfer direction 13 of the series of electronic components 7, from which the electronic component 10 has been already picked up, through the air flow path 12 communicated therewith. Accordingly, a relatively-stronger suction force is exerted on this electronic component 10 and, thus, the electronic component 10 can be smoothly picked up by the suction nozzle 14.

In order to enable smooth picking up, it is important that the interval portions 4 in the carrier tape 1 are provided with the concave slots 11 in the lower surfaces thereof, and the air flow paths 12 are formed between the carrier tape 1 and the bottom tape 9 as in the structure. If the interval portions 4 are provided with the concave slots in the upper surfaces thereof to form air flow paths between the carrier tape 1 and the top tape 8, this conversely weakens the suction force of the suction nozzle 14, which makes it impossible to raise expectations for a smooth picking up, in the picking up process.

Next, with reference to FIGS. 5 and 6, there will be described an example of a preferable method for fabricating the carrier tape 1 having the concave slots 11.

Figure 5:
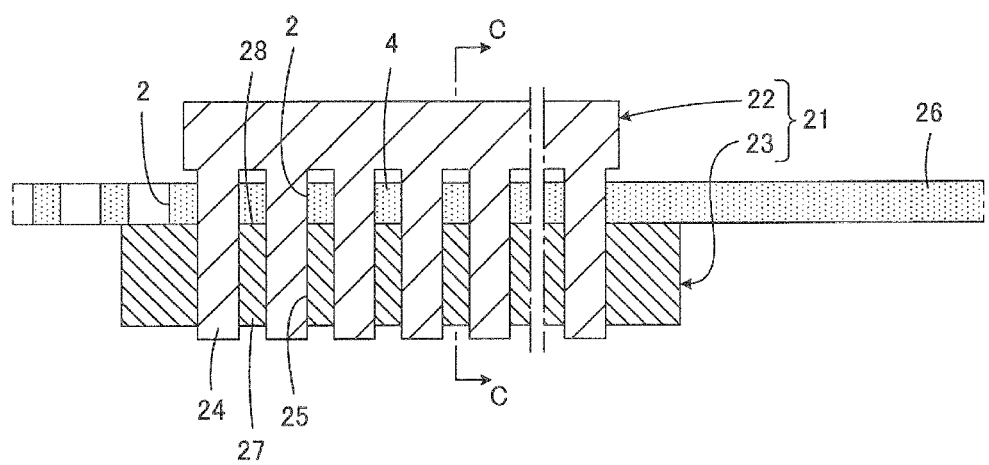
FIG. 5 is a cross-sectional view illustrating a method for fabricating the carrier tape 1 illustrated in FIG. 1 and illustrating a process for forming housing holes 2 in a tape material 26.

For fabricating the carrier tape 1, a carrier-tape fabrication die 21 as illustrated in FIG. 5 is used. The carrier-tape fabrication die 21 includes a male die 22 and a female die 23 which are provided such that they can be brought into engagement with each other and can be separated from each other.

The male die 22 includes a plurality of housing-hole formation convex portions 24 arranged therein. Further, although not illustrated in FIG. 5, the male die 22 has a plurality of protruding feeding-hole formation pins arranged therein. The housing-hole formation convex portions 24 and the feeding-hole formation pins, which are for forming the housing holes 2 and the feeding holes 3, respectively, are arranged in a distribution state which corresponds to the positions of the housing holes 2 and the feeding holes 3 to be formed.

On the other hand, the female die 23 includes a plurality of housing-hole formation concave portions 25 arranged therein. Further, although not illustrated in FIG. 5, the female die 23 has a plurality of feeding-hole formation concave portions arranged therein. The plurality of the housing-hole formation concave portions 25 are adapted to receive the plurality of the housing-hole formation convex portions 24 provided in the male die 22. Further, although not illustrated in the figures, the plurality of the feeding-hole formation concave portions are adapted to receive the plurality of the feeding-hole formation pins provided in the male die 22.

In order to fabricate the carrier tape 1, a tape material 26 made of a cardboard, for example, is prepared, and the tape material 26 is placed between the male die 22 and the female die 23. At this time, inter-concave-portion wall portions 27 positioned between the housing-hole formation concave portions 24 adjacent to each other are in contact with the tape material 26, at their end surfaces 28. Further, it should be noted that, in FIGS. 5 and 6, the tape material 26 is illustrated by exaggerating its thickness.

Next, the male die 22 and the female die 23 are brought into engagement with each other. In this process for bringing them into engagement with each other, the first housing-hole formation convex portions 24 are fitted into the housing-hole formation concave portions 25 while punching portions of the tape material 26, thereby forming housing holes 2 in the tape material 26. FIG. 5 illustrates a state after the formation of the housing holes 2.

Further, although not illustrated in FIG. 5, when the male die 22 and the female die 23 are brought into engagement with each other with the tape material 26 sandwiched therebetween, as described above, the feeding-hole formation pins are fitted into the feeding-hole formation concave portions while punching portions of the tape material 26, thereby further forming the feeding holes 3 in the tape material 26.

Further, in the process for bringing the male die 22 and the female die 23 into engagement with each other, the concave slots 11 are formed in the carrier tape 1. FIG. 6 is a cross-sectional view taken along the line C-C in FIG. 5, illustrating a portion of the female die 23, in an enlarging manner. Accordingly, in FIG. 6, there is illustrated a cross-sectional view illustrating the inter-concave-portion wall portion 26 positioned between housing-hole formation concave portions 25 adjacent to each other, in the direction of the arrangement of the housing-hole formation concave portions 25. As illustrated in FIG. 6, the inter-concave-portion wall portion 27 is provided with a convex surface 29 in the end surface 28 thereof. Accordingly, in the process for bringing the male die 22 and the female die 23 into engagement with each other, the interval portions 4 between the housing holes 2 adjacent to each other in the tape material 26 are pushed at their lower surfaces by the convex surfaces 29, which causes formation of the concave slots 11 therein.

Figure 6:
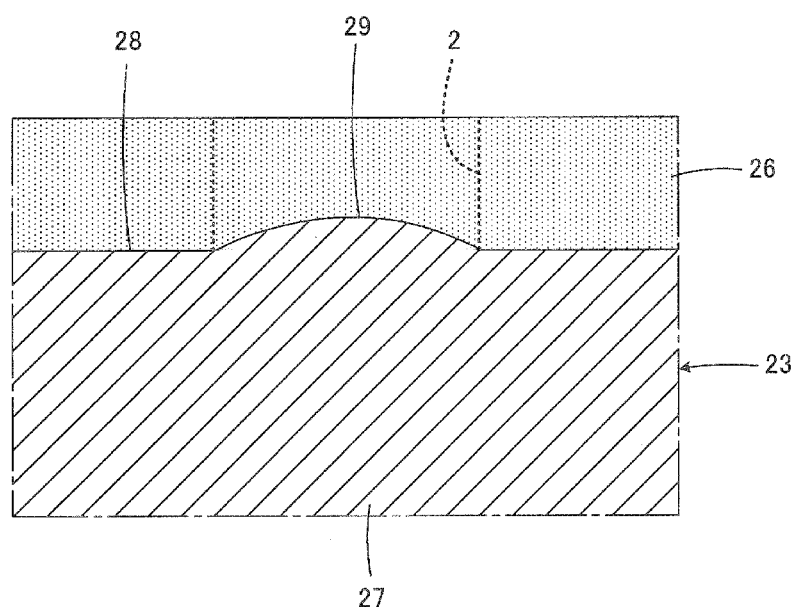
FIG. 6 is an enlarged cross-sectional view taken along line C-C of FIG. 5 illustrating a portion of a female die 23 illustrated in FIG. 5 together with the tape material 26.

Further, in FIG. 5, the convex surfaces 29 illustrated in FIG. 6, and the concave slots 11 formed thereby are not illustrated.

Next, the male die 22 and the female die 23 are returned to a state where they are separated from each other. A plurality of housing holes 2, a plurality of feeding holes 3, which are not illustrated in the figure, and the concave slots 11 have been formed in the tape material 26 placed on the female die 23.

Next, the tape material 26 is transferred by a predetermined distance in the longitudinal direction. Further, the above-described respective processes are repeated by interposing the process for transferring the tape material 26 in the longitudinal direction by the predetermined distance, so that the carrier tape 1 as illustrated in FIG. 1 is fabricated.

Further, the concave slots 11 can be also formed by performing stamping processing on the tape material 26, as an additional process, after the formation of the housing holes 2 and the feeding holes 3 therein, for example, instead of being formed at the same time as the formation of the housing holes 2 and the feeding holes 3 as described above.

Further, the shape of the concave slots 11 is not limited to that illustrated in the figures. The concave slots 11 can be arbitrarily changed in cross-sectional shape and planar shape, provided that they can form air flow paths 12 which cause adjacent housing holes 2 to communicate with each other, between the carrier tape 1 and the bottom tape 9, when the bottom tape 9 is attached to the lower surface of the carrier tape 1.

Further, the carrier tape to which the present disclosure is applied is not limited to carrier tapes having dimensions as those of the carrier tape 1 illustrated in FIG. 1 and can be also carrier tapes having other dimensions, as a matter of course.

What is claimed is:
1. A carrier tape comprising
a layer of cardboard, and
a plurality of housing holes for housing electronic components with a planar dimension of 0.6 mm×0.3 mm or less inside thereof such that the housing holes are arranged in a longitudinal direction and penetrate the layer of cardboard in a thickness direction,
a top tape attached to an upper surface of the layer of cardboard and a bottom tape attached to a lower surface of the layer of cardboard,
interval portions between the housing holes adjacent to each other are provided, in the lower surface, with a concave slot connecting the housing holes adjacent to each other,
wherein the concave slot has a bottom surface having a cross-sectional shape entirely recessed from opposite ends of the housing holes as starting points, when viewed in a direction of arrangement of the housing holes.

2. The carrier tape according to claim 1, wherein the concave slot has a widthwise dimension which is larger than a dimension of the interval portions between the housing holes adjacent to each other, measured in a direction of arrangement of the housing holes.

3. The carrier tape according to claim 1, wherein a pitch of arrangement of the plurality of the housing holes is 1 mm or less.

4. The carrier tape according to claim 1, wherein the concave slot has a bottom surface having a bilaterally-symmetric cross-sectional shape when viewed in a direction of arrangement of the housing holes.

5. A package tape comprising:
a carrier tape having a layer of cardboard, and
a plurality of housing holes for housing electronic components with a planar dimension of 0.6 mm×0.3 mm or less inside thereof such that the housing holes are arranged in a longitudinal direction and penetrate the layer of cardboard in a thickness direction,
a top tape attached to an upper surface of the layer of cardboard and a bottom tape attached to a lower surface of the layer of cardboard,
interval portions between the housing holes adjacent to each other are provided, in the lower surface, with a concave slot connecting the housing holes adjacent to each other; and
the bottom tape being attached to the lower surface of the carrier tape in such a way as to close lower-surface openings of the housing holes; and
an air flow path defined between the carrier tape and the bottom tape by the concave slot such that adjacent housing holes are communicated with each other via the air flow path,
wherein the concave slot has a bottom surface having a cross-sectional shape entirely recessed from opposite ends of the housing holes as starting points, when viewed in a direction of arrangement of the housing holes.

6. A series of electronic components comprising:
a package tape including a carrier tape having a layer of cardboard, and
a plurality of housing holes for housing electronic components with a planar dimension of 0.6 mm×0.3 mm or less inside thereof such that the housing holes are arranged in a longitudinal direction and penetrate the layer of cardboard in a thickness direction,
a top tape attached to an upper surface of the layer of cardboard and a bottom tape attached to a lower surface of the layer of cardboard, interval portions between the housing holes adjacent to each other are provided, in the lower surface, with a concave slot connecting the housing holes adjacent to each other; and the bottom tape being attached to the lower surface of the carrier tape in such a way as to close lower-surface openings of the housing holes; and an air flow path defined between the carrier tape and the bottom tape by the concave slot such that adjacent housing holes are communicated with each other via the air flow path;

electronic components housed within the housing holes; and the top tape being attached to the upper surface of the carrier tape in such a way as to close upper-surface openings of the housing holes, wherein the concave slot has a bottom surface having a cross-sectional shape entirely recessed from opposite ends of the housing holes as starting points, when viewed in a direction of arrangement of the housing holes.

\* \* \* \* \*